US010667337B2

(12) United States Patent
Guatta

(10) Patent No.: US 10,667,337 B2
(45) Date of Patent: May 26, 2020

(54) METHOD OF CONTROL OF A MULTIFEED RADIO FREQUENCY DEVICE

(71) Applicant: WHIRLPOOL CORPORATION, Benton Harbor, MI (US)

(72) Inventor: Davide Guatta, Benton Harbor, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 979 days.

(21) Appl. No.: 15/107,593

(22) PCT Filed: Dec. 23, 2013

(86) PCT No.: PCT/US2013/077433
§ 371 (c)(1),
(2) Date: Jun. 23, 2016

(87) PCT Pub. No.: WO2015/099650
PCT Pub. Date: Jul. 2, 2015

(65) Prior Publication Data
US 2016/0330803 A1 Nov. 10, 2016

(51) Int. Cl.
*H05B 6/68* (2006.01)
*G01R 29/08* (2006.01)
(Continued)

(52) U.S. Cl.
CPC ......... *H05B 6/686* (2013.01); *G01R 29/0892* (2013.01); *H05B 6/705* (2013.01);
(Continued)

(58) Field of Classification Search
CPC .......... H05B 6/686; H05B 6/705; H05B 6/72; H05B 2206/044; H05B 2206/046;
(Continued)

(56) References Cited

U.S. PATENT DOCUMENTS 4,641,006 A * 2/1987 Ross .................... H05B 6/725 219/749
6,259,078 B1 * 7/2001 Araya .................... F26B 3/347 219/696
(Continued)

FOREIGN PATENT DOCUMENTS

EP 2239994 A1 10/2010
JP 2004047322 A 2/2004
(Continued)

*Primary Examiner* — Dana Ross
*Assistant Examiner* — Joseph M Baillargeon
(74) *Attorney, Agent, or Firm* — Price Heneveld LLP

(57) ABSTRACT

A method of coherently controlling irradiation of an object in an enclosed cavity by at least two radio frequency (RF) feeds includes setting an amplitude, a phase and a frequency for each of the RF feeds; actuating all of the RF feeds with the respectively set amplitudes, phases and frequencies to irradiate the object; measuring a reflected power at each of the RF feeds; characterizing a complete scattering parameter matrix of the enclosed cavity while the object is being irradiated; and adjusting the power, the phase and the frequency for each of the RF feeds based on the complete scattering parameter matrix and values of the power, the phase and the frequency of the RF feeds before adjusting.

16 Claims, 6 Drawing Sheets

(51) Int. Cl.
*H05B 6/70* (2006.01)
*H05B 6/72* (2006.01)

(52) U.S. Cl.
CPC ......... *H05B 6/72* (2013.01); *H05B 2206/044* (2013.01); *H05B 2206/046* (2013.01); *Y02B 40/143* (2013.01); *Y02B 40/146* (2013.01)

(58) Field of Classification Search
CPC ...... H05B 6/687; H05B 6/688; H05B 6/6447; H05B 6/68; H05B 6/70; H05B 6/681; H05B 6/682; H05B 6/701; G01R 29/0892; Y02B 40/143; Y02B 40/146
USPC ....... 219/709, 702, 409, 746, 747, 728, 750, 219/760, 761, 385, 438, 756; 324/637
See application file for complete search history.

(56) References Cited

U.S. PATENT DOCUMENTS

2010/0176121 A1* 7/2010 Nobue .................. H05B 6/686 219/716
2010/0252551 A1* 10/2010 Nordh ..................... H05B 6/74 219/702
2012/0103972 A1 5/2012 Okajima
2015/0070029 A1* 3/2015 Libman ................. H05B 6/686 324/637

FOREIGN PATENT DOCUMENTS

RU 2399170 C1 9/2010
WO 2011058537 A1 5/2011

* cited by examiner 20
24
26A
26D
22A
22B
26B
26C
12
18A
18B
18C
18D
16
14
28
10

METHOD OF CONTROL OF A MULTIFEED RADIO FREQUENCY DEVICE

BACKGROUND

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron may result in non-uniform heating of the food. To more evenly heat food, microwave ovens include, among other things, mechanical solutions such as a microwave stirrer and a turntable for rotating the food.

SUMMARY

In one aspect, a method of coherently controlling irradiation of an object in an enclosed cavity by two or more radio frequency (RF) feeds is provided. The method includes setting an amplitude, a phase and a frequency for each of the RF feeds; actuating all of the RF feeds with the respectively set amplitudes, phases and frequencies to irradiate the object; measuring a reflected power at each of the RF feeds; characterizing a complete scattering matrix of the enclosed cavity while the object is being irradiated; and adjusting the power, the phase and the frequency for each of the at least two RF feeds based on the complete scattering matrix and values of the power, the phase and the frequency of the at least two RF feeds before adjusting.

DETAILED DESCRIPTION

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape the wave patterns in the enclosed cavity, the multiple RF feeds may radiate waves with separately controlled electromagnetic characteristics to maintain coherence (that is, a stationary interference pattern) within the enclosed cavity. For example, each RF feed may transmit a different phase and/or amplitude with respect to the other feeds. Other electromagnetic characteristics may be common among the RF feeds. For example, each RF feed may transmit at a common but variable frequency. Although the following embodiments are directed to a cooking appliance where RF feeds direct electromagnetic radiation to heat an object in an enclosed cavity, it will be understood that the methods described herein and the inventive concepts derived herefrom are not so limited. The covered concepts and methods are applicable to any RF device where electromagnetic radiation is directed to an enclosed cavity to act on an object inside the cavity. Exemplary devices include ovens, dryers, steamers, and the like.

Figure 1:
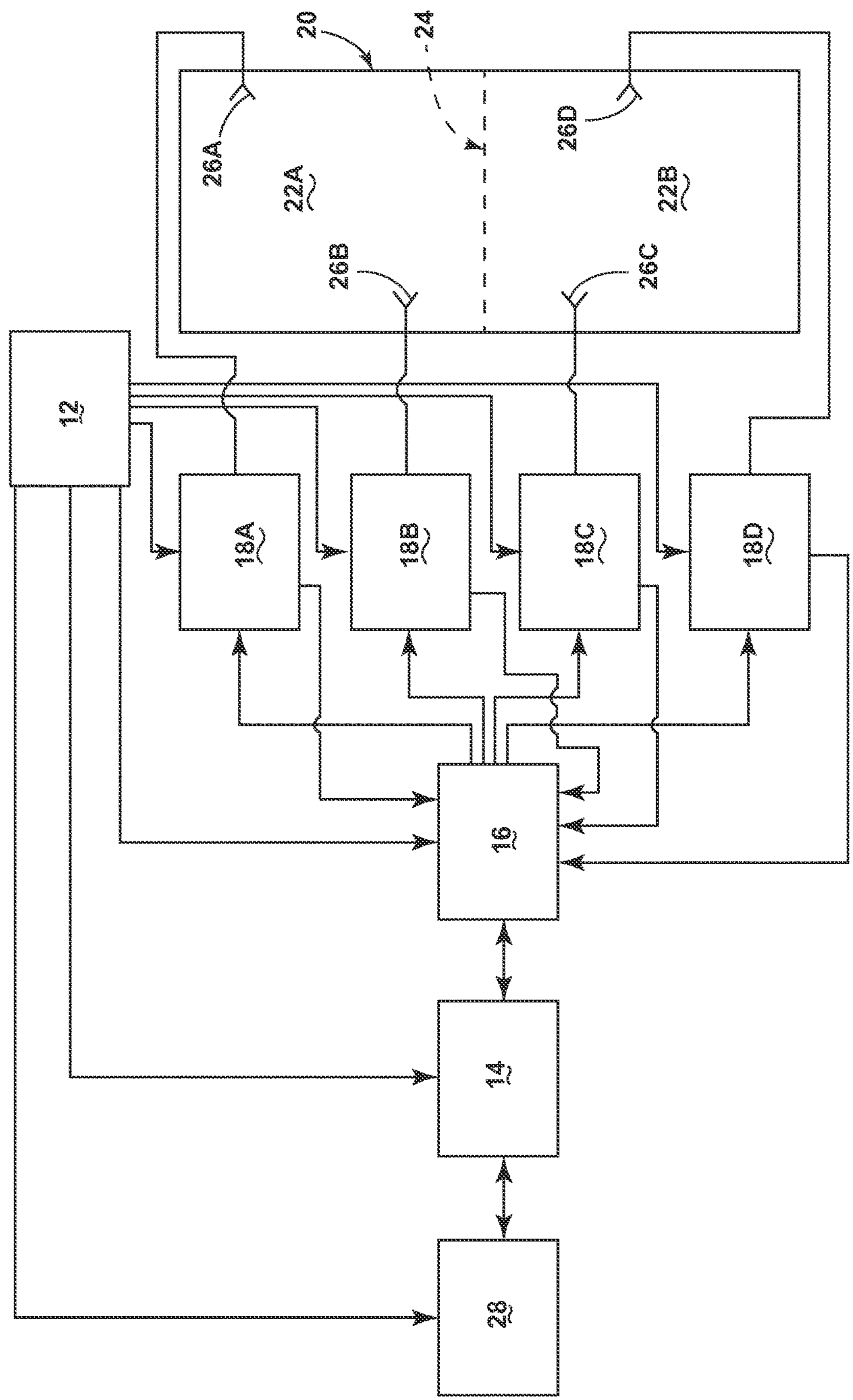
FIG. 1 shows a block diagram of an electromagnetic cooking device with multiple coherent RF feeds according to an embodiment.

FIG. 1 shows a block diagram of an electromagnetic cooking device 10 with multiple coherent RF feeds 26A-D according to one embodiment. As shown in FIG. 1, the electromagnetic cooking device 10 includes a power supply 12, a controller 14, an RF signal generator 16, a human-machine interface 28 and multiple high-power RF amplifiers 18A-D coupled to the multiple RF feeds 26A-D. The multiple RF feeds 26A-D each couple RF power from one of the multiple high-power RF amplifiers 18A-D into the enclosed cavity 20.

The power supply 12 provides electrical power derived from mains electricity to the controller 14, the RF signal generator 16, the human-machine interface 28 and the multiple high-power RF amplifiers 18A-D. The power supply 12 converts the mains electricity to the required power level of each of the devices it powers. The power supply 12 may deliver a variable output voltage level. For example, the power supply 12 may output a voltage level selectively controlled in 0.5-volt steps. In this way, the power supply 12 may be configured to typically supply 28 volts direct current to each of the high-power RF amplifiers 18A-D, but may supply a lower voltage, such as 15 volts direct current, to decrease an RF output power level by a desired level.

The controller 14 may be included in the electromagnetic cooking device 10, which may be operably coupled with various components of the electromagnetic cooking device 10 to implement a cooking cycle. The controller 14 may also be operably coupled with a control panel or human-machine interface 28 for receiving user-selected inputs and communicating information to a user. The human-machine interface 28 may include operational controls such as dials, lights, switches, touch screen elements, and displays enabling a user to input commands, such as a cooking cycle, to the controller 14 and receive information. The user interface 28 may be one or more elements, which may be centralized or dispersed relative to each other.

The controller 14 may be provided with a memory and a central processing unit (CPU), and may be preferably embodied in a microcontroller. The memory may be used for storing control software that may be executed by the CPU in completing a cooking cycle. For example, the memory may store one or more pre-programmed cooking cycles that may be selected by a user and completed by the electromagnetic cooking device 10. The controller 14 may also receive input from one or more sensors. Non-limiting examples of sensors that may be communicably coupled with the controller 14 include peak level detectors known in the art of RF engineering for measuring RF power levels and temperature sensors for measuring the temperature of the enclosed cavity 20 or one or more of the high-power amplifiers 18A-D.

Based on the user input provided by the human-machine interface 28 and data including the incident and reflected power magnitudes coming from the multiple high-power amplifiers 18A-D (represented in FIG. 1 by the path from each of the high-power amplifiers 18A-D through the RF signal generator 16 to the controller 14), the controller 14 may determine the cooking strategy and calculate the settings for the RF signal generator 16. In this way, one of the main functions of controller 14 is to actuate the electromagnetic cooking device 10 to instantiate the cooking cycle as initiated by the user. The RF signal generator 16 as described below then may generate multiple RF waveforms, that is, one for each high-power amplifier 18A-D based on the settings indicated by the controller 14.

The high-power amplifiers 18A-D, each coupled to one of the RF feeds 26A-D, output a high power RF signal based on a low power RF signal provided by the RF signal generator 16. The low power RF signal input to each of the high-power amplifiers 18A-D may be amplified by transforming the direct current electrical power provided by the power supply 12 into a high power radio frequency signal. For example, each high-power amplifier 18A-D may be capable of outputting a 250-watt RF signal. The maximum output wattage for each high-power amplifier may be more or less than 250 watts depending upon the implementation.

Additionally, each of the high-power amplifiers 18A-D includes a sensing capability to measure the magnitude of the incident and the reflected power levels at the amplifier output. The measured reflected power at the output of each high-power amplifier 18A-D indicates a power level returned to the high-power amplifier 18A-D as a result of an impedance mismatch between the high-power amplifier 18A-D and the enclosed cavity 20. Besides providing feedback to the controller 14 and the RF signal generator 16 to dictate, in part, a cooking strategy, the reflected power level may be significant because excess reflected power may damage the high-power amplifier 18A-D.

Consequently, each high-power amplifier 18A-D may include a dummy load to absorb excessive RF reflections. Along with the determination of the reflected power level at each of the high-power amplifiers 18A-D, temperature sensing at the high-power amplifier 18A-D including at the dummy load may provide the data necessary to determine if the reflected power level has exceeded a predetermined threshold. If the threshold is exceeded, any of the controlling elements in the RF transmission chain including the power supply 12, controller 14, the RF signal generator 16, or the high-power amplifier 18A-D may determine that the high-power amplifier 18A-D may be switched to a lower power level or completely turned off. For example, each high-power amplifier 18A-D may switch itself off automatically if the reflected power level or sensed temperature is too high for several milliseconds. Alternatively, the power supply 12 may cut the direct current power supplied to the high-power amplifier 18A-D.

The multiple RF feeds 26A-D couple power from the multiple high-power RF amplifiers 18A-D to the enclosed cavity 20. The multiple RF feeds 26A-D may be coupled to the enclosed cavity 20 in spatially separated but fixed physical locations. The multiple RF feeds 26A-D may be implemented via waveguide structures designed for low power loss propagation of RF signals. For example, metallic, rectangular waveguides known in microwave engineering are capable of guiding RF power from a high-power amplifier 18A-D to the enclosed cavity 20 with a power attenuation of approximately 0.03 decibels per meter.

The enclosed cavity 20 may selectively include subcavities 22A-B by insertion of an optional divider 24 therein. The enclosed cavity 20 may include on at least one side a shielded door to allow user access to the interior of the enclosed cavity 20 for placement and retrieval of food or the optional divider 24.

The transmitted bandwidth of each of the RF feeds 26A-D may include frequencies ranging from 2.4 GHz to 2.5 GHz. The RF feeds 26A-D may be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and may include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

Figure 2:
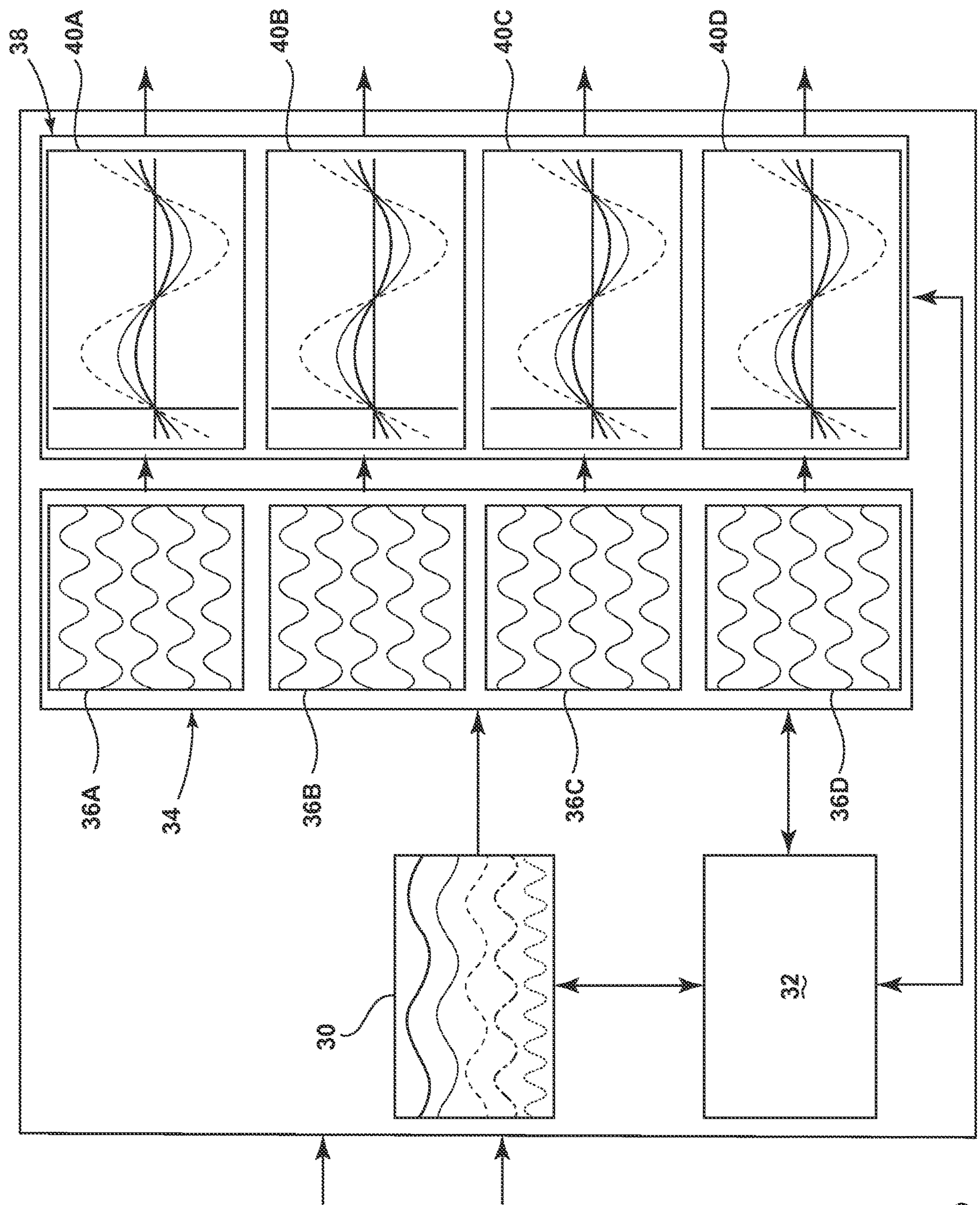
FIG. 2 shows a block diagram of the small signal RF generator of FIG. 1.

FIG. 2 shows a block diagram of the RF signal generator 16. The RF signal generator 16 includes a frequency generator 30, a phase generator 34 and an amplitude generator 38 sequentially coupled and all under the direction of an RF controller 32. In this way, the actual frequency, phases and amplitudes to be output from the RF signal generator 16 are programmable through the RF controller 32, preferably implemented as a digital control interface. The RF signal generator 16 may be physically separate from the cooking controller 14 or may be physically mounted onto or integrated into the controller 14. The RF signal generator 16 is preferably implemented as a bespoke integrated circuit.

As shown in FIG. 2 the RF signal generator 16 outputs four RF channels 40A-D that share a common but variable frequency (e.g. ranging from 2.4 GHz to 2.5 GHz), but are settable in phase and amplitude for each RF channel 40A-D. The configuration described herein is exemplary and should not be considered limiting. For example, the RF signal generator 16 may be configured to output more or less channels and may include the capability to output a unique variable frequency for each of the channels depending upon the implementation.

As previously described, the RF signal generator 16 may derive power from the power supply 12 and input one or more control signals from the controller 14. Additional inputs may include the incident and reflected power levels determined by the high-power amplifiers 18A-D. Based on these inputs, the RF controller 32 may select a frequency and signal the frequency generator 30 to output a signal indicative of the selected frequency. As represented pictorially in the block representing the frequency generator 30 in FIG. 2, the selected frequency determines a sinusoidal signal whose frequency ranges across a set of discrete frequencies. For example, a selectable bandwidth ranging from 2.4 GHz to 2.5 GHz may be discretized at a resolution of 1 MHz allowing for 101 unique frequency selections.

After the frequency generator 30, the signal is divided per output channel and directed to the phase generator 34. Each channel may be assigned a distinct phase 36A-D, that is, the initial angle of a sinusoidal function. As represented pictorially in the block representing the phase generator 36A-D in FIG. 2, the selected phase of the RF signal for a channel may range across a set of discrete angles. For example, a selectable phase (wrapped across half a cycle of oscillation or 180 degrees) may be discretized at a resolution of 10 degrees allowing for 19 unique phase selections per channel.

Subsequent to the phase generator 34, the RF signal per channel may be directed to the amplitude generator 38. The RF controller 32 may assign each channel (shown in FIG. 2 with a common frequency and distinct phase) to output a distinct amplitude 40A-D. As represented pictorially in the block representing the per channel amplitude generator in FIG. 2, the selected amplitude of the RF signal may range across a set of discrete amplitudes (or power levels). For example, a selectable amplitude may be discretized at a resolution of 0.5 decibels across a range of 0 to 23 decibels allowing for 47 unique amplitude selections per channel.

The amplitude of each channel may be controlled by one of several methods depending upon the implementation. For example, control of the supply voltage of the amplitude generator 38 for each channel may result in an output amplitude for each channel 40A-D from the RF signal generator 16 that is directly proportional to the desired RF signal output for the respective high-power amplifier 18A-D. Alternatively, the per channel output may be encoded as a pulse-width modulated signal where the amplitude level is encoded by the duty cycle of the pulse width modulated signal. Yet another alternative is to coordinate the per channel output of the power supply 12 to vary the supply voltage supplied to each of the high-power amplifiers 18A-D to control the final amplitude of the RF signal transmitted to the enclosed cavity 20.

As described above, the electromagnetic cooking device 10 may deliver a controlled amount of power at multiple RF feeds 26A-D into the enclosed cavity 20. Further, by maintaining control of the amplitude, frequency and phase of the power delivered from each RF feed 26A-D, the electromagnetic cooking device 10 may coherently control the power delivered into the enclosed cavity 20. Coherent RF sources deliver power in a controlled manner to exploit the interference properties of electromagnetic waves. That is, over a defined area of space and duration of time, coherent RF sources may produce stationary interference patterns such that the electric field is distributed in an additive manner. Consequently, interference patterns may add to create an electromagnetic field distribution that is greater in amplitude than any of the RF sources (i.e. constructive interference) or less than any of the RF sources (i.e. destructive interference). The coordination of the RF sources and characterization of the operating environment (i.e. the enclosed cavity and the contents within) may enable coherent control of the electromagnetic cooking and maximize the coupling of RF power with the object to be heated.

Figure 3:
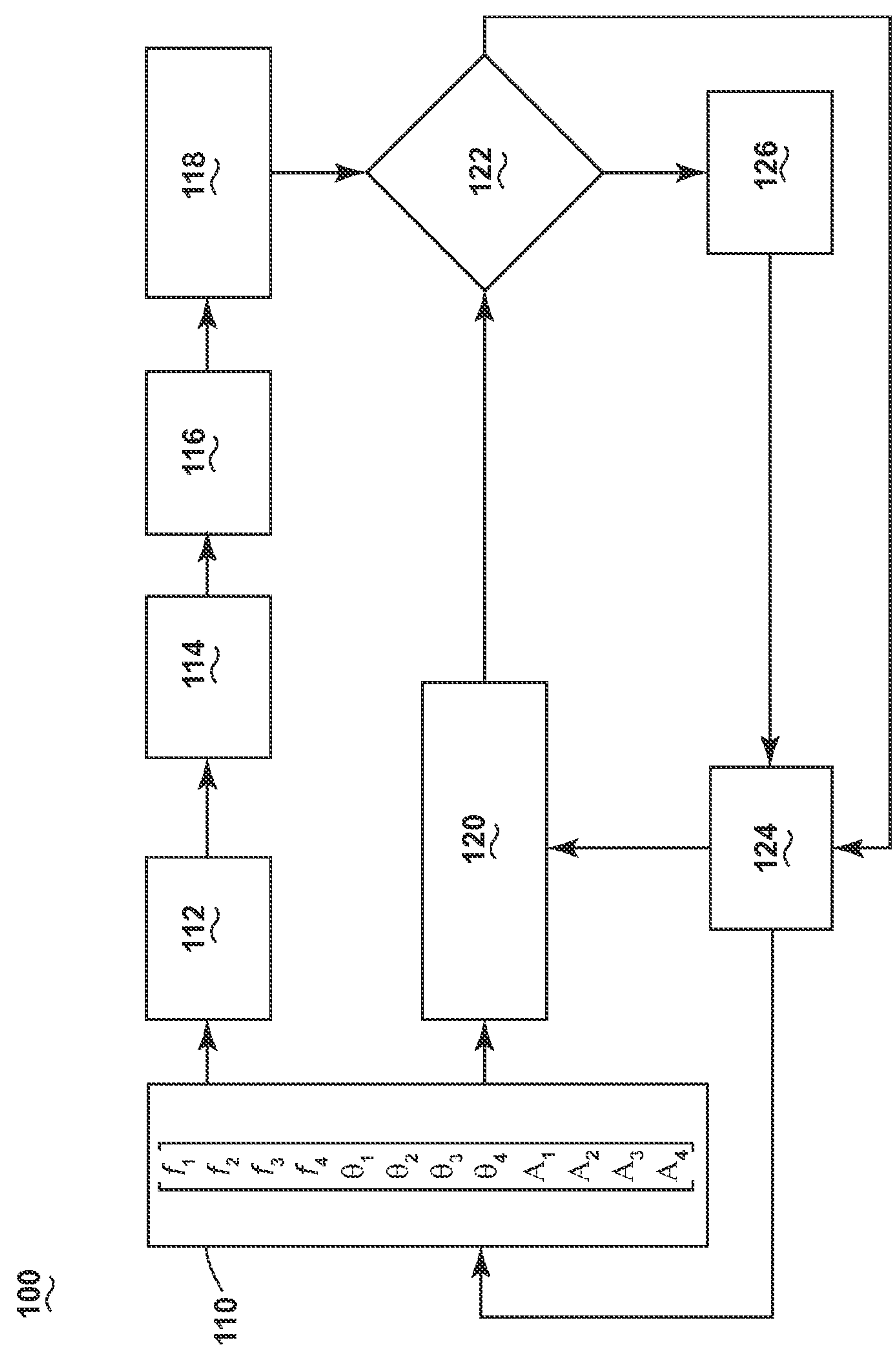
FIG. 3 shows a flowchart describing a method to characterize the enclosed cavity of the electromagnetic cooking device of FIG. 1.

FIG. 3 shows a flowchart describing a method 100 to characterize the enclosed cavity 20 of the electromagnetic cooking device 10 of FIG. 1. The method 100 exploits measurements of RF signal reflection to characterize the enclosed cavity 20 by an estimate of a complete scattering parameter matrix 124. The estimate of the complete scattering parameter matrix 124 is an input for the determination of an electromagnetic field distribution within an enclosed cavity 116 that will maximize the RF coupling with the object being heated. The controller 14 may determine a vector 110 of RF field actuations and direct the RF signal generator 16 to instantiate the vector 110 and actualize the RF signals. The controller 14 may attempt to update the vector 110 at a fast enough rate in order to maximize RF coupling and avoid exposing the high-power amplifiers 18A-D to excess reflected power.

In the enclosed cavity 20 of the multiple RF feed electromagnetic cooking device 10, the estimate of the complete scattering parameter matrix 124 describes the input-output relationship among the RF feeds in the system and characterizes the electric field distribution in the enclosed cavity 116. The presence of reflected power at the RF feeds is due to the mismatch between the RF sources (i.e. the high-power amplifier 18A-D and RF feeds 26A-D) and the load (i.e. the enclosed cavity and the physical properties of its contents). The analytical characterization of the relationship between the incident and reflected electromagnetic energy (at a given frequency) is described by the complete scattering parameter matrix S according to:

$$Sx=y$$

The vector inputs are x, the vector outputs are y. These quantities are complex, meaning that they comprise both a real and an imaginary component and may be described in a phasor notation with a magnitude and phase. The estimate of the complete scattering parameter matrix 124 may change over time (i.e. temporal decoherence) as the object in the enclosed cavity is heated. Therefore, the estimate of the complete scattering parameter matrix 124 may be subsequently updated.

The identification process to compute an estimate of the complete scattering parameter matrix 124 may be computationally costly or interfere with the heating process and, therefore, the number of scattering parameter matrix identifications may be advantageously minimized. According to the method 100 to characterize the enclosed cavity 20, energy is applied to the enclosed cavity according to the vector 110 describing the frequency, phase and amplitude that the RF signal generator 16 ascribes to each of the RF channels in an RF chain 112. As described above, the controller 14, the RF signal generator 16, the power supply 12, the high-power amplifiers 18A-D and the RF feeds 26A-D form the RF chain 112 that delivers a controlled output power 114 to effect an electromagnetic field distribution in the enclosed cavity 116.

An observer (i.e. a logical system that models a real system in order to provide an estimate of the state of the real system) may be implemented to compare a measured reflected power 118 resulting from the electromagnetic field distribution in the enclosed cavity 116 to a predicted reflected power 120 based on the current estimate of the complete scattering parameter matrix 124. If, at 122, the difference between the predicted reflected power 120 and the measured reflected power 118 exceeds a predetermined threshold, the controller 14 may initiate a new estimate of a complete scattering parameter matrix 126. The comparison may include a direct comparison between the predicted reflected power 120 and the measured reflected power 118 or other metrics may be contemplated. For example, if the sum of the differences between the predicted reflected power 120 and the measured reflected power 118 over a predetermined time exceeds a predetermined threshold, a new estimate of the complete scattering parameter matrix 126 may be initiated.

By adjusting the amplitude or power, the phase and the frequency for each of the RF feeds 26A-D at each of the RF feeds based on the complete scattering parameter matrix and values of the amplitude or power, the phase and the frequency of the RF feeds 26A-D may be iteratively adjusted throughout a cooking cycle. During a cooking process, the controller 14 may select a series of control vectors 110 based on a power delivery strategy. For example, the controller 14 may set the control vectors 110 in response to the complete scattering parameter matrix to achieve a minimum reflected power. Alternatively, the controller 14 may select the control vectors 110 to achieve a setpoint, that is, to deliver a predetermined power level to the enclosed cavity 20 and its contents. If a sequence of control vectors 110 results in an actuation sequence that efficiently heats the object in the enclosed cavity and effectively characterizes the enclosed cavity (that is, provides useful information for estimating the complete scattering parameter matrix), the complete scattering parameter matrix estimation may occur simultaneously with the heating process.

Figure 4:
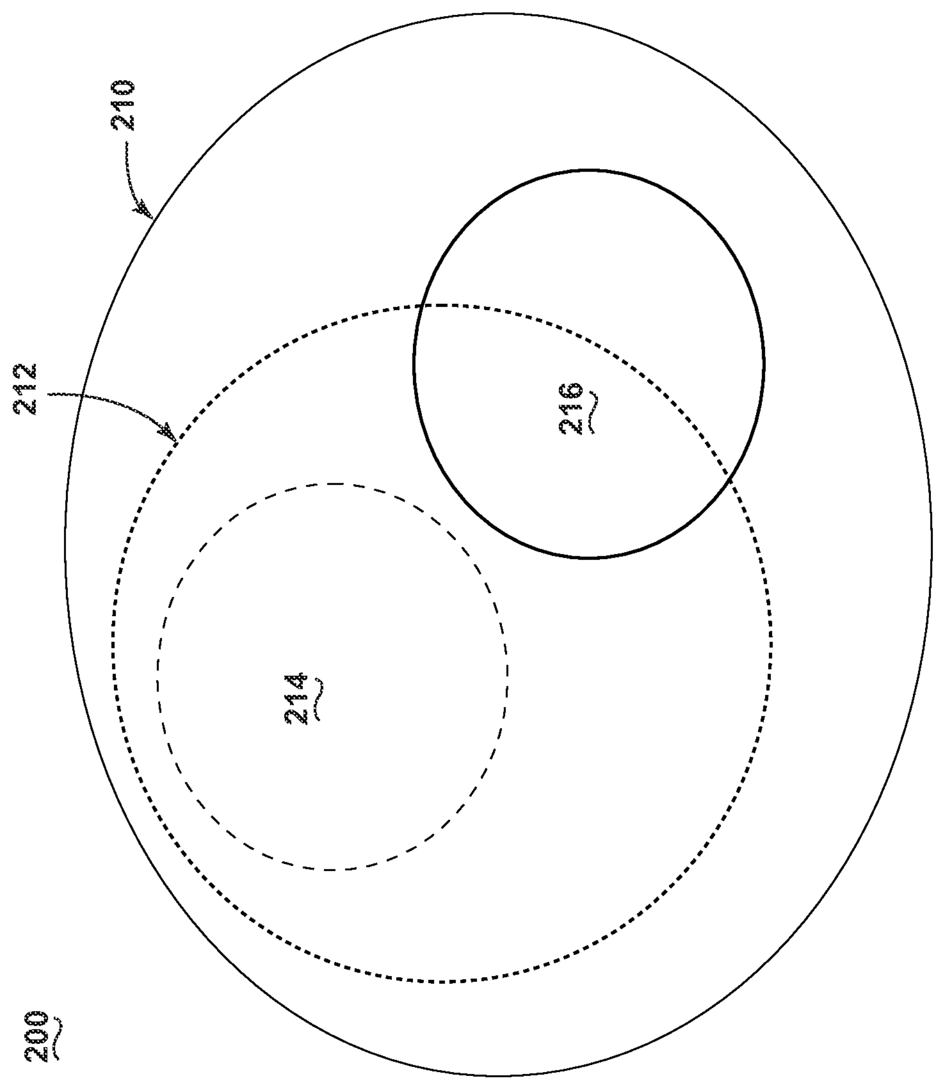
FIG. 4 shows an Euler diagram of possible actuations of the feeds of the electromagnetic cooking device.

FIG. 4 shows an Euler diagram 200 of possible actuation sequences 210 of the RF feeds of the electromagnetic cooking device 10. Typically, methods used to estimate the complete scattering parameter matrix require a predetermined and sequential pattern of actuations of the RF feeds. For example, a scattering parameter matrix identification scheme may require a predetermined actuation sequence in which the RF feeds must be sequentially switched on and operated one-by-one in a sequence, represented for an exemplary four-channel system by the matrix (where 1 indicates an active channel and 0 an inactive channel; the columns indicative of RF feeds and the rows indicative of an actuation step):

[1 0 0 0;
0 1 0 0;
0 0 1 0;
0 0 0 1]).

The sequential actuation sequences for estimating a complete scattering parameter matrix 214 may not be conducive to efficient cooking and may consequently decrease the performance of the electromagnetic cooking device 10. As represented in FIG. 4, the sequential actuation sequences for estimating the complete scattering parameter matrix 214 and the actuation sequences for efficient cooking 216 may not overlap. Conversely, conjoint identification schemes 212 require no pattern specific actuation sequences to obtain the data necessary for estimating the complete scattering parameter matrix 214. Consequently, during an identification sequence, all of the RF feeds may be actuated simultaneously, a subset of the RF feeds (26A-D) may be actuated simultaneously, or the RF feeds may be actuated sequentially as described above. When selecting an actuation sequence (that is consecutive actuations of the RF feeds), the RF feeds may be randomly actuated. Examples of three actuations sequenced for an exemplary four RF feed system may include: actuating all of the feeds simultaneously (where 1 indicates an active channel and 0 an inactive channel; the columns indicative of RF feeds and the rows indicative of an actuation step):

[1 1 1 1;
1 1 1 1;
1 1 1 1]);

actuating a subset of the feeds simultaneously (where 1 indicates an active channel and 0 an inactive channel; the columns indicative of RF feeds and the rows indicative of an actuation step):

[1 0 0 1;
1 1 0 0;
0 0 1 1]);

and randomly actuating a subset of the feeds (where 1 indicates an active channel and 0 an inactive channel; the columns indicative of RF feeds and the rows indicative of an actuation step):

[0 1 1 1;
0 1 1 0;
1 1 0 1]);

As represented in FIG. 4, the conjoint identification schemes 212 that do not require sequential actuation sequences for estimating the complete scattering parameter matrix 214 may include significant overlap with actuation sequences that are efficient for cooking 216. Thus, with high probability, estimation of the complete scattering parameter matrix 214 may be performed during the cooking process without having to interrupt the cooking cycle. In other words, actuations of the RF feeds may be selected based on maximizing efficiency for cooking and the controller may estimate the complete scattering parameter matrix 214 opportunistically based on in situ measurements of the incident and reflected power at the RF feeds.

Figure 5:
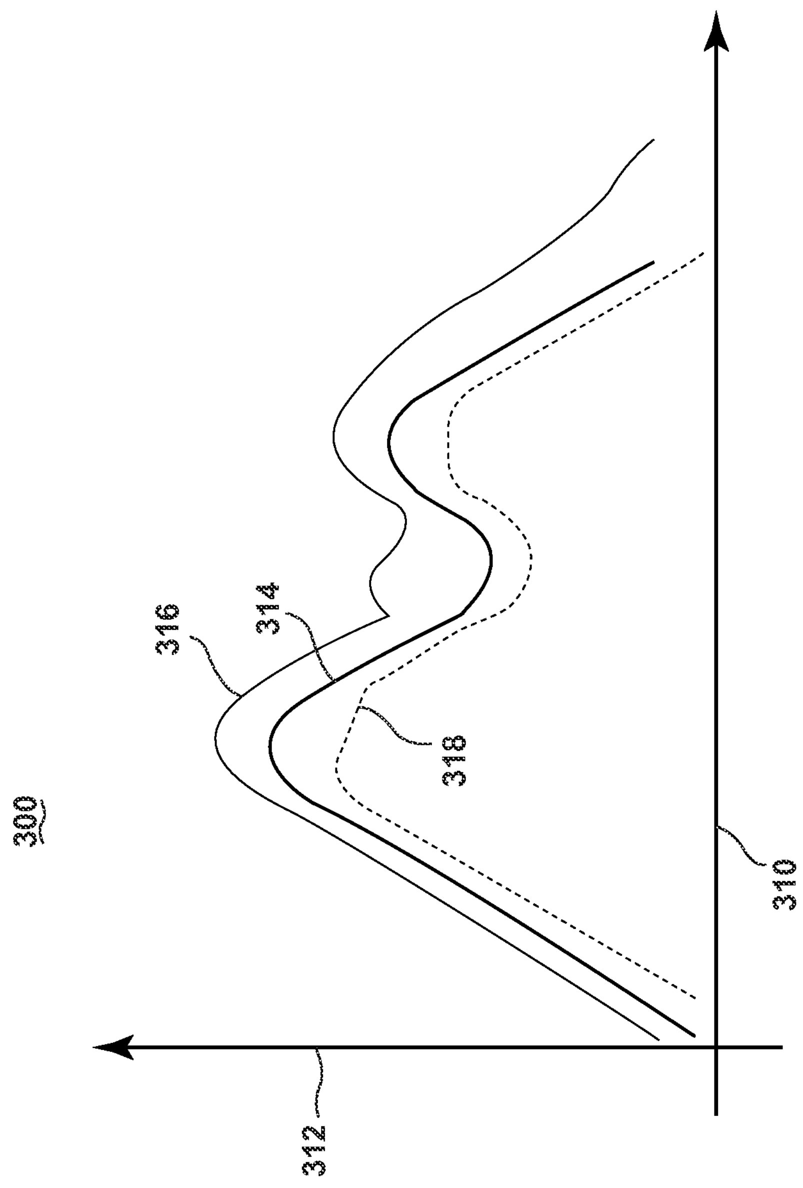
FIG. 5 shows a plot of efficiency versus frequency for three possible actuations of the feeds of the electromagnetic cooking device.

FIG. 5 shows a plot 300 of efficiency 312 versus frequency 310 for three possible actuations of the RF feeds 18A-D of the electromagnetic cooking device 10. Efficiency 312 for an RF system may be defined by the relationship between the incident and reflected powers. For example, an RF system is highly efficient when the reflected power is very small in comparison to the incident power. As previously described, interference resulting from the interaction of multiple coherent RF sources (each from an RF feed 26A-D) in an enclosed cavity 20 of an electromagnetic cooking device 10 is a controllable phenomenon. The precise control of electromagnetic reflections and transmissions for controlling the electromagnetic field distribution in the enclosed cavity 20 is determined by, not only return loss and crosstalk magnitude, but also by the phase (or phase difference between the multiple RF feeds 18A-D). That is, the magnitude of the scattering parameters cannot completely characterize the enclosed cavity and its contents. Control of the phase shift of the RF sources allows for controlled application of various interference patterns resulting in precise control of reflections, transmissions, energy balance and injected power into the enclosed cavity 20. In order to determine the magnitude and phase shift to be applied by the RF feeds 26A-D, a vectorial scattering parameter matrix may be considered.

Consider a matrix representation of an RF system with two feeds. The following example for two feeds is directly extendable to more than two feeds and should not be considered limiting. The complete scattering parameter matrix S that characterizes the relationship between the inputs x and outputs y of a two source RF system may represented as:

$$\begin{bmatrix} S_{11} & S_{12} \\ S_{21} & S_{22} \end{bmatrix} \begin{bmatrix} x_1 \\ x_2 \end{bmatrix} = \begin{bmatrix} y_1 \\ y_2 \end{bmatrix}$$

The quantity of interest for the RF cooking is the power, both transmitted and reflected. Consequently, the reflected power may be expressed as the expansion of the square of the y phasors as:

$$P_{Y_1} = |S_{11}|^2|x_1|^2 + |S_{12}|^2|x_2|^2 + 2|S_{11}||S_{12}||x_1||x_2|\cos[(\measuredangle x_1 - \measuredangle x_2) + (\measuredangle S_{12} - \measuredangle S_{11})]$$

$$P_{Y_2} = |S_{21}|^2|x_1|^2 + |S_{22}|^2|x_2|^2 + 2|S_{21}||S_{22}||x_1||x_2|\cos[(\measuredangle x_1 - \measuredangle x_2) + (\measuredangle S_{22} - \measuredangle S_{21})]$$

Therefore, the reflected power is expressed as the summation of magnitude-only terms:

$$P_{Y_1} = |S_{11}|^2|x_1|^2 + |S_{12}|^2|x_2|^2 + \ldots$$

$$P_{Y_2} = |S_{21}|^2|x_1|^2 + |S_{22}|^2|x_2|^2 + \ldots$$

and a combination of the phase of the sensed scattering parameters and the phase of the inputs (i.e. the control variable):

$$P_{Y_1} = \ldots + 2|S_{11}||S_{12}||x_1||x_2|\cos[(\measuredangle x_1 - \measuredangle x_2) + (\measuredangle S_{12} - \measuredangle S_{11})]$$

$$P_{Y_2} = \ldots + 2|S_{21}||S_{22}||x_1||x_2|\cos[(\measuredangle x_1 - \measuredangle x_2) + (\measuredangle S_{22} - \measuredangle S_{21})]$$

By not including the phase-dependent terms (that is, holding the phase of the inputs constant), the efficiency (i.e. a quantity that characterizes the relationship between the transmitted and reflected power) of the system as a function of frequency is one-dimensional, as shown by the interior plot 314 in FIG. 5. In other words, some frequencies are more efficient than others for heating a given load in the enclosed cavity. However, by controlling the phase of the inputs to the RF system, the relative efficiencies of the frequencies for a given load are dynamic; that is, the selection of the phases provides another dimension that may be optimized to control the cooking cycle. Consider the additional plots 318 and 316 where the phase of signal output from the RF feeds is varied relative to a static phase selection of the interior plot 314. The plots 314, 316, 318 represent slices of a multidimensional surface whereby the efficiency of the RF system for heating the enclosed cavity is a function of at least frequency and the selected phases of the multiple RF feeds. By using the vectorial characterization described above and leveraging electromagnetic interference in the enclosed cavity 20, a cooking cycle may be performed more efficiently per actuated frequency.

Figure 6:
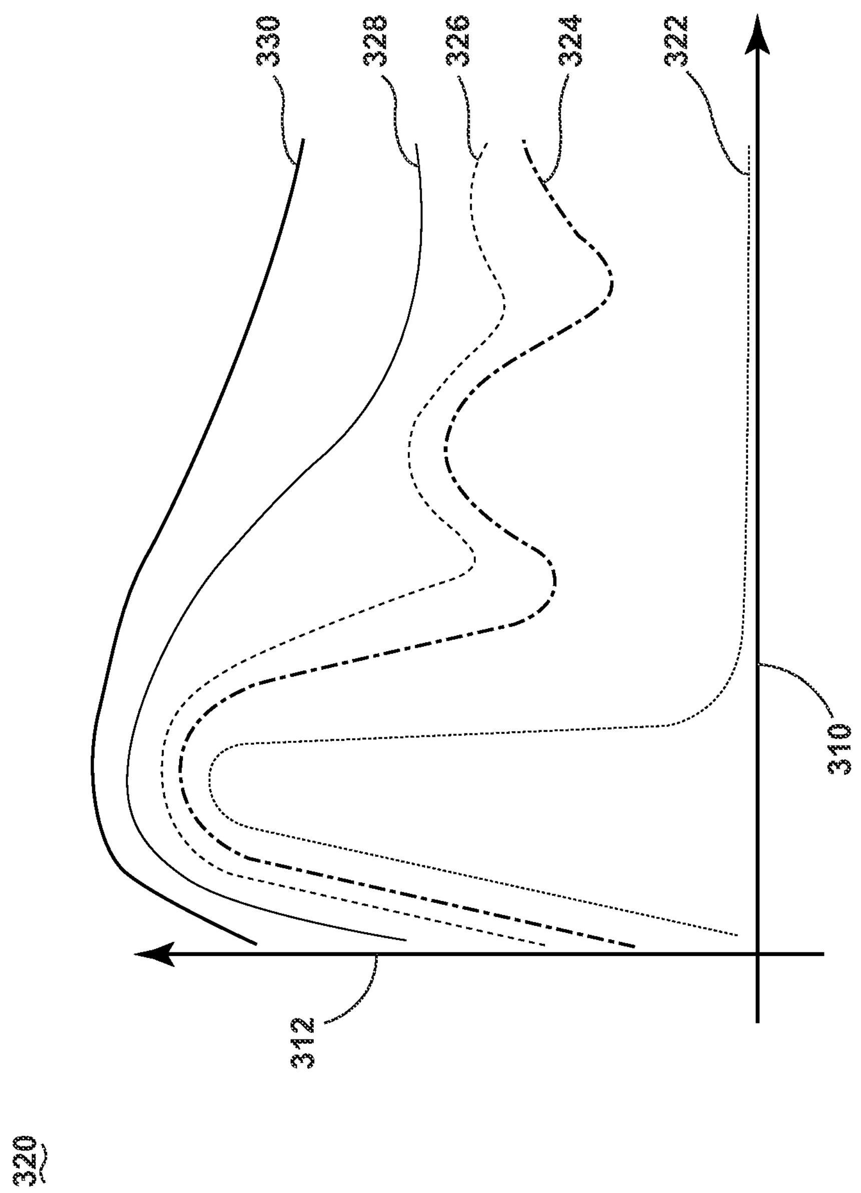
FIG. 6 shows a plot of efficiency versus frequency for possible actuations further constrained by the available power of the RF feeds of the electromagnetic cooking device.

FIG. 6 shows a plot 320 of efficiency 312 versus frequency 310 for possible actuations, further constrained by the available power of the RF feeds of the electromagnetic cooking device 10. In real cooking applications, the available power for each RF feeds is constrained. By including the actual amount of power available for injection into the enclosed cavity 20 by the RF feeds 26A-D as a variable in the multidimensional surface describing the efficiency of the RF system, the efficiency per frequency becomes a more dynamic function. As shown, the power available for the RF feeds is greatest in plot 322 and steadily decreases for 324, 326, 328 and 330. Ultimately, the most efficient frequency is most obvious when the available power is the least constrained. Therefore, a constrained vectorial control system may exploit knowledge of the complete scattering parameter matrix and the maximum available power of the RF sources to generate output waveforms that take full advantage of a coherent RF feed array. The inputs and corresponding outputs may provide the necessary information to produce an optimum (i.e. efficient) heating strategy for RF cooking.

It is contemplated that the present disclosure encompasses at least the following inventive concepts:

Method of characterizing the electric field distribution in an enclosed cavity

1. A method for characterizing the electric field distribution in an enclosed cavity of a device configured to generate at least two radio frequency (RF) feeds for irradiating an object in the enclosed cavity, the method characterized by:

setting a power, a phase and a frequency for each of the at least two RF feeds for irradiating the object;

actuating all of the at least two RF feeds with the respectively set powers, phases and frequencies to irradiate the object;

measuring the reflected power at each of the at least two RF feeds; and characterizing a complete scattering matrix of the enclosed cavity while the object is being irradiated.

2. The method of 1, wherein the frequency for each of the at least two RF feeds is the same while one of the power or the phase for each is different.

3. The method of any of 1-2, wherein the setting is predetermined to heat the object.

4. The method of any of 1-3, further characterized by predicting a reflected power at each of the at least two RF feeds based on the complete scattering matrix.

5. The method of 4, further characterized by comparing the measured reflected power at each of the at least two RF feeds with the predicted reflected power of the at least two RF feeds, and if the comparison exceeds a predetermined threshold, then repeating the setting, actuating, measuring, and characterizing steps.

6. The method of any of 1-5, wherein all of the at least two RF feeds are actuated simultaneously or randomly.

Coherent Control for Multifeed RF Systems

1. A method of coherently controlling irradiation of an object in an enclosed cavity by at least two radio frequency (RF) feeds, the method characterized by:

setting a power, a phase and a frequency for each of the at least two RF feeds;

actuating all of the at least two RF feeds with the respectively set powers, phases and frequencies to irradiate the object;

measuring the reflected power at each of the at least two RF feeds;

characterizing a complete scattering matrix of the enclosed cavity while the object is being irradiated; and adjusting the power, the phase and the frequency for each of the at least two RF feeds based on the complete scattering matrix and values of the power, the phase and the frequency of the at least two RF feeds before adjusting.

2. The method of 1, wherein the adjusting is also based on power available at each of the at least two RF feeds.

3. The method of 2, wherein the adjusting is constrained by the power available at each of the at least two RF feeds.

4. The method of 1, wherein all of the at least two RF feeds are actuated simultaneously.

5. The method of 1, wherein all of the at least two RF feeds are actuated randomly.

6. The method of 1, wherein all of the at least two RF feeds are actuated sequentially.

7. The method of 1, wherein the adjusting is determined to achieve a minimum reflected power at each of the at least two RF feeds based on the complete scattering matrix and values of the power, the phase and the frequency of the at least two RF feeds before adjusting.

8. The method of 1, wherein the adjusting is determined to deliver power to the enclosed cavity at a setpoint based on the complete scattering matrix (124) and values of the power, the phase and the frequency of the at least two RF feeds before adjusting.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A method of coherently controlling irradiation of an object in an enclosed cavity by at least two radio frequency (RF) feeds, the method comprising:

setting an amplitude, a phase and a frequency for each of the at least two RF feeds;

actuating all of the at least two RF feeds with the respectively set amplitudes, phases and frequencies to irradiate the object;

measuring a reflected power at each of the at least two RF feeds;

characterizing a complete scattering parameter matrix of the enclosed cavity while the object is being irradiated; and adjusting the power, the phase and the frequency for each of the at least two RF feeds based on the complete scattering parameter matrix and values of the power, the phase and the frequency of the at least two RF feeds before adjusting, wherein the adjusting is determined to achieve a minimum reflected power at each of the at least two RF feeds based on the complete scattering parameter matrix and values of the power, the phase and the frequency of the at least two RF feeds before adjusting.

2. The method of claim 1, wherein the adjusting is also based on power available at each of the at least two RF feeds.

3. The method of claim 2, wherein the adjusting is constrained by the power available at each of the at least two RF feeds.

4. The method of claim 1, wherein all of the at least two RF feeds are actuated simultaneously.

5. The method of claim 1, wherein all of the at least two RF feeds are actuated randomly.

6. The method of claim 1, wherein all of the at least two RF feeds are actuated sequentially.

7. The method of claim 1, wherein the adjusting is determined to deliver power to the enclosed cavity at a set point based on the complete scattering parameter matrix and values of the power, the phase and the frequency of the at least two RF feeds before adjusting.

8. The method of claim 1, further comprising predicting a reflected power at each of the at least two RF feeds based on the complete scattering matrix.

9. The method of claim 8, further comprising comparing the measured reflected power at each of the at least two RF feeds with the predicted reflected power of the at least two RF feeds, and if the comparison exceeds a predetermined threshold, then repeating the setting, actuating, measuring, and characterizing steps.

10. A method for characterizing the electric field distribution in an enclosed cavity of a device configured to generate at least two radio frequency (RF) feeds for irradiating an object in the enclosed cavity, the method comprising:

setting a power, a phase and a frequency for each of the at least two RF feeds for irradiating the object;

actuating all of the at least two RF feeds with the respectively set powers, phases and frequencies to irradiate the object;

measuring the reflected power at each of the at least two RF feeds; and characterizing a complete scattering matrix of the enclosed cavity while the object is being irradiated, wherein all of the at least two RF feeds are actuated randomly.

11. The method of claim 10, wherein the frequency for each of the at least two RF feeds is the same while one of the power or the phase for each is different.

12. The method of claim 10, wherein the setting is predetermined to heat the object.

13. The method of claim 10, further comprising predicting a reflected power at each of the at least two RF feeds based on the complete scattering matrix.

14. The method of claim 13, further comprising comparing the measured reflected power at each of the at least two RF feeds with the predicted reflected power of the at least two RF feeds, and if the comparison exceeds a predetermined threshold, then repeating the setting, actuating, measuring, and characterizing steps.

15. A method for characterizing the electric field distribution in an enclosed cavity of a device configured to generate at least two radio frequency (RF) feeds for irradiating an object in the enclosed cavity, the method comprising:

setting a power, a phase and a frequency for each of the at least two RF feeds for irradiating the object;

actuating all of the at least two RF feeds with the respectively set powers, phases and frequencies to irradiate the object;

measuring the reflected power at each of the at least two RF feeds; and characterizing a complete scattering matrix of the enclosed cavity while the object is being irradiated; and predicting a reflected power at each of the at least two RF feeds based on the complete scattering matrix.

16. The method of claim 15, further comprising comparing the measured reflected power at each of the at least two RF feeds with the predicted reflected power of the at least two RF feeds, and if the comparison exceeds a predetermined threshold, then repeating the setting, actuating, measuring, and characterizing steps.

* * * * *